(12) United States Patent
Darabi

(10) Patent No.: US 8,620,249 B2
(45) Date of Patent: Dec. 31, 2013

(54) METHOD AND SYSTEM FOR PROCESS, VOLTAGE, AND TEMPERATURE (PVT) MEASUREMENT AND CALIBRATION

(75) Inventor: Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 799 days.

(21) Appl. No.: 10/977,000

(22) Filed: Oct. 29, 2004

(65) Prior Publication Data

US 2006/0094387 A1 May 4, 2006

(51) Int. Cl.
*H04B 1/40* (2006.01)

(52) U.S. Cl.
USPC ........... 455/296; 455/130; 455/136; 455/317; 455/63.1; 375/298

(58) Field of Classification Search
USPC ............ 455/334, 296, 324; 375/298; 340/905
See application file for complete search history.

(56) References Cited

U.S. PATENT DOCUMENTS

| | | | | |
|---|---|---|---|---|
| 5,798,660 A | * | 8/1998 | Cheng | 327/65 |
| 5,898,912 A | * | 4/1999 | Heck et al. | 455/234.2 |
| 5,917,430 A | * | 6/1999 | Greneker et al. | 340/905 |
| 6,100,827 A | * | 8/2000 | Boesch et al. | 341/118 |
| 6,498,929 B1 | * | 12/2002 | Tsurumi et al. | 455/296 |
| 6,535,725 B2 | * | 3/2003 | Hatcher et al. | 455/317 |
| 6,606,359 B1 | * | 8/2003 | Nag et al. | 375/348 |
| 6,628,274 B1 | * | 9/2003 | Morita | 345/209 |
| 7,263,344 B2 | * | 8/2007 | Manku | 455/323 |
| 2003/0174783 A1 | * | 9/2003 | Rahman et al. | 375/298 |

* cited by examiner

*Primary Examiner* — Lewis West
*Assistant Examiner* — Richard Chan
(74) *Attorney, Agent, or Firm* — Sterne, Kessler, Goldstein & Fox PLLC

(57) ABSTRACT

In RF transceivers a method and system for process, voltage, and temperature (PVT) measurement and calibration are provided. A nominal DC offset current may be generated at a nominal temperature and may be based on a calibration voltage. A nominal transconductance parameter may be determined based on the nominal DC offset current and the calibration voltage. The nominal transconductance may be stored and may be utilized to determine temperature and process conditions during operation. In another embodiment, a plurality of DC offset currents may be generated at different temperatures and these generated DC offset currents may be based on a calibration voltage. The calibration voltage may be constant over the range of temperatures. Transconductance parameters may be determined based on the DC offset currents and the calibration voltage. The transconductance parameters may be stored and may be utilized to determine temperature and process conditions during operation.

22 Claims, 7 Drawing Sheets

METHOD AND SYSTEM FOR PROCESS, VOLTAGE, AND TEMPERATURE (PVT) MEASUREMENT AND CALIBRATION

CROSS-REFERENCE TO RELATED APPLICATIONS/INCORPORATION BY REFERENCE

This application is related to the following applications, each of which is incorporated herein by reference in its entirety for all purposes:
U.S. patent application Ser. No. 10/976,976 filed Oct. 29, 2004;
U.S. patent application Ser. No. 10/976,977 filed Oct. 29, 2004;
U.S. patent application Ser. No. 10/976,575 filed Oct. 29, 2004;
U.S. patent application Ser. No. 10/977,464 filed Oct. 29, 2004:
U.S. patent application Ser. No. 10/977,798 filed Oct. 29, 2004;
U.S. patent application Ser. No. 10/977,005 filed Oct. 29, 2004;
U.S. patent application Ser. No. 10/977,771 filed Oct. 29, 2004;
U.S. patent application Ser. No. 10/977,868 filed Oct. 29, 2004;
U.S. patent application Ser. No. 10/976,666 filed Oct. 29, 2004;
U.S. patent application Ser. No. 10/977,631 filed Oct. 29, 2004;
U.S. patent application Ser. No. 10/976,639 filed Oct. 29, 2004;
U.S. patent application Ser. No. 10/977,210 filed Oct. 29, 2004;
U.S. patent application Ser. No. 10/977,872 filed Oct. 29, 2004;
U.S. patent application Ser. No. 10/977,869 filed Oct. 29, 2004;
U.S. patent application Ser. No. 10/977,874 filed Oct. 29, 2004; and
U.S. patent application Ser. No. 10/976,996 filed Oct. 29, 2004.

FEDERALLY SPONSORED RESEARCH OR DEVELOPMENT

Not applicable.

MICROFICHE/COPYRIGHT REFERENCE

Not applicable.

FIELD OF THE INVENTION

Certain embodiments of the invention relate to the processing of radio signals in a radio frequency (RF) transceiver. More specifically, certain embodiments of the invention relate to a method and system for a second order input intercept point (IIP2) correction.

BACKGROUND OF THE INVENTION

In radio frequency (RF) applications, an RF receiver or a receiver portion of an RF transceiver may be required to tolerate the presence of large interfering signals lying within the passband that corresponds to a communication channel of interest. These interfering signals may have originated from users in adjacent channels and/or from transmission sources which may be relatively far removed in frequency from the channel of interest but whose large transmission power may still cause significant interference problems. These interfering signals may be referred to as blockers and their relative frequency and/or detected power to that of the desired signal may vary based on transmission scheme and/or operational conditions. The effect of interfering signals in the channel of interest may result in, for example, bit error rate (BER) degradation in digital RF systems and audible and/or visible signal-to-noise ratio (SNR) degradation in analog RF systems.

However, the ability to provide an interference-tolerant design may be difficult to accomplish as second-order distortion effects are increasingly becoming a limitation in circuitry utilized by the wireless receivers. For example, mixers and/or other circuitry which may be utilized to downconvert a channel of interest to a zero intermediate frequency (IF) or to a low IF may generate, as a result of second-order nonlinearities, spectral components from blocker signals which may be at or near DC. The effect of these spectral components may be to introduce a DC offset to the desired signals at the zero IF which may result in signal saturation or, as mentioned above, a noticeable degradation to the system's noise performance.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for process, voltage, and temperature (PVT) measurement and calibration. Aspects of the method may comprise detecting a nominal DC offset current in a radio frequency (RF) receiver. The nominal DC offset current may be detected in, for example, an "I" (in-phase) signal component path in the RF receiver. The nominal DC offset current may also be detected in, for example, a "Q" (quadrature) signal component path in said RF receiver.

The method may comprise generating the nominal DC offset current at a nominal operating temperature. The method may also comprise selecting the nominal operating temperature. The nominal DC offset current may be based on a calibration voltage. The nominal DC offset current may be generated based on a plurality of current driver control signals. Moreover, the polarity of the nominal DC offset current may be selected based on a polarity selection signal. A nominal transconductance parameter may be determined based on the detected nominal DC offset current and the calibration voltage and may be stored after being determined.

In another embodiment, aspects of the method may comprise detecting a plurality of DC offset currents in a radio frequency (RF) receiver. The DC offset currents may be detected in, for example, an "I" (in-phase) signal component path in the RF receiver. The DC offset currents may also be detected in, for example, a "Q" (quadrature) signal component path in said RF receiver.

The method may also comprise generating the DC offset currents at a plurality of operating temperatures. The DC offset currents may be based on a calibration voltage. The method may also comprise selecting the range of operating temperatures. The DC offset currents may be generated based on a plurality of current driver control signals. Moreover, the polarity of the DC offset currents may be selected based on a polarity selection signal. A plurality of transconductance parameters may be determined based on the detected DC offset currents and the calibration voltage and may be stored after being determined.

In another embodiment of the invention, a machine-readable storage may be provided having stored thereon, a computer program having at least one code for PVT measurement and calibration, the at least one code section being executable by a machine for causing the machine to perform steps in the method described above.

Aspects of the system may comprise a DC offset sensor that detects a nominal DC offset current in a radio frequency (RF) receiver. The DC offset sensor may detect the nominal DC offset current in, for example, an "I" (in-phase) signal component path in the RF receiver. The DC offset sensor may detect the nominal DC offset current in, for example, a "Q" (quadrature) signal component path in said RF receiver. The nominal DC offset current may be generated at a nominal operating temperature. The nominal DC offset current may be based on a calibration voltage.

The system may comprise at least one processor that determines a nominal transconductance parameter based on the detected nominal DC offset current and the calibration voltage. The system may also comprise a memory that stores the nominal transconductance parameter. The memory may also store the nominal operating temperature. The memory may comprise, for example, a look-up table. The system may also comprise a circuit that may be adapted to generate the nominal DC offset current based on a plurality of current driver control signals. The circuit may also be adapted to select a polarity for the nominal DC offset current based on a polarity selection signal.

In another embodiment, the system may comprise a DC offset sensor that detects a plurality of DC offset currents in a radio frequency (RF) receiver. The DC offset sensor may detect the DC offset currents in, for example, an "I" (in-phase) signal component path in the RF receiver. The DC offset sensor may detect the plurality of DC offset currents in, for example, a "Q" (quadrature) signal component path in the RF receiver. The DC offset currents may be generated at a plurality of operating temperatures. The DC offset currents may be based on a calibration voltage.

The system may also comprise at least one processor that determines a plurality of nominal transconductance parameters based on the DC offset currents and the calibration voltage. The system may also comprise a memory that stores the transconductance parameters. The memory may also store the operating temperatures. The memory may comprise, for example, a look-up table. The system may also comprise a circuit that may be adapted to generate each of the DC offset currents based on a plurality of current driver control signals. The circuit may also be adapted to select a polarity for the DC offset currents based on a polarity selection signal.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a process, voltage, and temperature (PVT) measurement and calibration. By determining a nominal value of the transconductance parameter β during a nominal set of operating conditions, readings on current conditions may be compared to those for the nominal conditions to determine whether temperature variations and/or process variations had taken place and what means may be utilized to compensate for these variations. In this regard, a DCT offset sensor and current injection circuits may be utilized to perform these measurements. Since the DC offset sensor and the current injection circuits may be utilized in various other operations in a radio frequency (RF) transceiver, this solution provides an efficient and accurate approach that may be utilized to optimize the operation of the RF transceiver as operating conditions vary.

Figure 1:
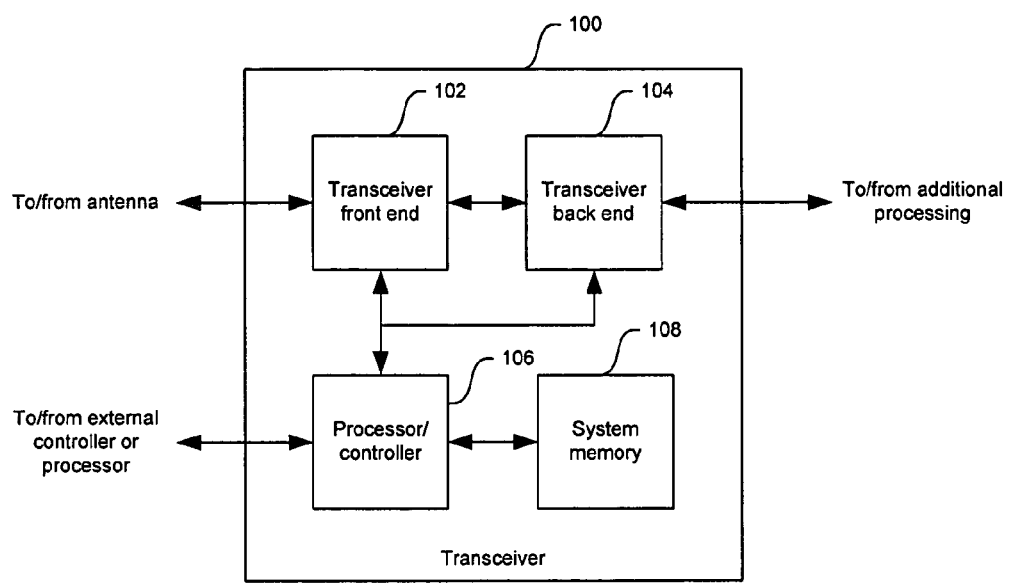
FIG. 1 is a block diagram of an exemplary RF transceiver system, in accordance with an embodiment of the invention.

FIG. 1 is a block diagram of an exemplary RF transceiver system, in accordance with an embodiment of the invention. Referring to FIG. 1, the RF transceiver system 100 may comprise a transceiver front end 102, a transceiver back end 104, a controller/processor 106, and a system memory 108. The transceiver front end 102 may comprise suitable logic, circuitry, and/or code that may be adapted to receive and/or transmit an RF signal. The transceiver front end 102 may comprise a receiver portion and a transmitter portion. Both the transmitter portion and the receiver portion may be coupled to an external antenna for signal broadcasting and signal reception respectively. The transceiver front end 102 may modulate a signal for transmission and may also demodulate a received signal before further processing of the received signal is to take place. Moreover, the transceiver front end 102 may provide other functions, for example, digital-to-analog conversion, analog-to-digital conversion, frequency downsampling, frequency upsampling, and/or filtering.

The transceiver back end 104 may comprise suitable logic, circuitry, and/or code that may be adapted to digitally process received signals from the transceiver front end 104 and/or to process signals received from at least one processing block, which may be located external to the RF transceiver system 100. The controller/processor 106 may comprise suitable logic, circuitry, and/or code that may be adapted to control the operations of the transceiver front end 102 and/or the transceiver back end 104. For example, the controller/processor 106 may be utilized to update and/or modify programmable parameters and/or values in a plurality of components, devices, and/or processing elements in the transceiver front end 102 and/or in the transceiver back end 104. Control and/or data information may be transferred from at least one controller and/or processor external to the RF transceiver system 100 to the controller/processor 106 during the operation of the RF transceiver system 100. Moreover, the controller/processor 106 may also transfer control and/or data information to at least one controller and/or processor external to the RF transceiver system 100.

The controller/processor 106 may utilize the received control and/or data information to determine the mode of operation of the transceiver front end 102. For example, the controller/processor 106 may select between measuring and storing a nominal parameter that corresponds to a nominal set of operating PVT conditions or measuring and storing a plurality of parameters that correspond to a plurality of operating PVT conditions. Moreover, the controller/processor 106 may be adapted to determine a value of a transistor transconductance parameter β, or a value of a parameter that may correspond to β, as representative of the PVT conditions that existed when the measurement took place. The values determined for p, and/or for parameters that may correspond to β, may be transferred to the system memory 108, for example, from the controller/processor 106. The controller/processor 106 may also be adapted to compare a current reading of β, for example, that corresponds to a current set of PVT operating conditions, to stored readings of β, that correspond to known PVT operating conditions. This comparison may be utilized to determine whether the operating settings for certain portions of the transceiver front end 102 may need correction as operating conditions vary. The system memory 108 may comprise suitable logic, circuitry, and/or code that may be adapted to store a plurality of control and/or data information, including values that may correspond to readings and/or measurements of the transconductance parameter β performed during PVT measurement and calibration operations.

Figure 2:
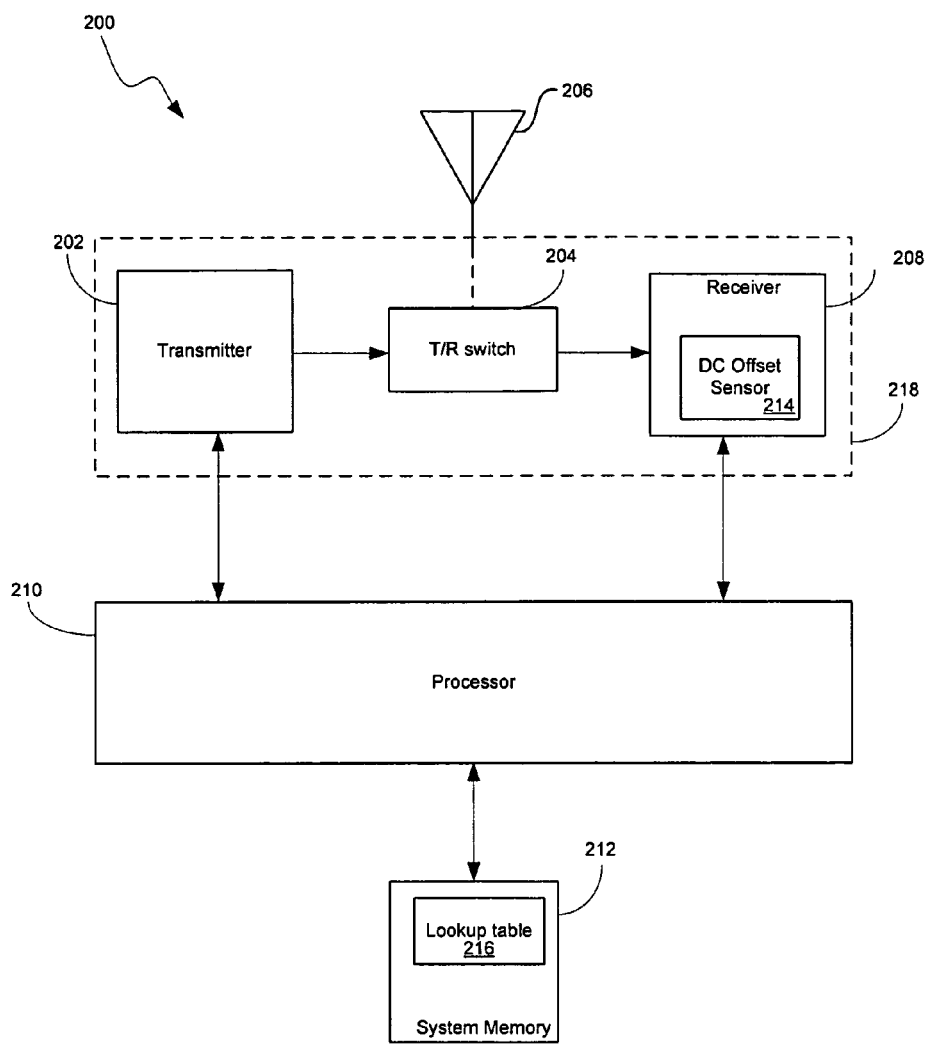
FIG. 2 is a block diagram of an exemplary RF transceiver system illustrating a lookup table, in accordance with an embodiment of the invention.

FIG. 2 is a block diagram of an exemplary RF transceiver system illustrating a lookup table, in accordance with an embodiment of the invention. Referring to FIG. 2, there is shown a system 200 that comprises a transceiver front end 218, an antenna 206, a processor 210 and a system memory 212. The transceiver front end 218 may comprise a transmitter 202, a transmit/receive (T/R) switch 204 and a receiver 208. The receiver 208 may comprise a DC offset sensor 214. The system memory 212 may comprise a lookup table 216.

The transceiver front end 218 may be adapted to modulate a signal for transmission and may also demodulate a received signal before further processing of the received signal. The transmitter 202 may comprise suitable logic and/or circuitry that may be adapted to modulate an information signal to a suitable carrier frequency. The T/R switch 204 may comprise suitable logic, circuitry, and/or code that may be adapted to select between a transmit mode, in which signals may be transferred from the transceiver front end 218, and a receive mode, in which signals may be transferred from either an external antenna or a testing fixture, for example, to the transceiver front end 218. The antenna 206 may be adapted to transmit the processed signals from the transmitter 202 to the receiver 208. The receiver 208 may comprise suitable logic and/or circuitry that may be adapted to receive the processed signals from the transmitter 202. The receiver 208 may comprise a DC offset sensor 214 that may be adapted to sense or detect DC offset levels in the I path and/or the Q path of the receiver 208. The processor 210 may be adapted to receive control and/or data information to determine the mode of operation of the transceiver front end 218. The system memory 212 may comprise suitable logic, circuitry, and/or code that may be adapted to store a plurality of control and/or data information. The lookup table 216 may comprise suitable logic, circuitry and/or code that may be adapted to store values that may correspond to readings and/or measurements of the transconductance parameter p of the transistor coupled in the I path and/or the Q path of the receiver 208, the input voltage of the transistor coupled in the I path and/or the Q path of the receiver 208 and the temperature of the transistor coupled in the I path and/or the Q path of the receiver.

In operation, the DC offset sensor 214 may be adapted to detect a DC offset voltage in the I path and/or the Q path of the receiver 208. The DC offset sensor 214 may transfer a first DC offset current parameter to a first injection circuit coupled in the I path of the receiver 208 and a second DC offset current parameter to a second injection circuit coupled in the Q path of the receiver 208. The transconductance $\beta_1$ and transconductance $\beta_2$ of the transistors that may be coupled in the I path and the Q path of the receiver respectively may be determined utilizing the first and second DC offset current parameters.

A lookup table 216 may be generated based on the input voltage, transconductance and the temperature of the transistor that may be coupled in the I path and/or the Q path of the receiver 208. An amplifier gain setting may be determined from the lookup table 216 corresponding to a particular temperature, for example, by comparing the transconductance β and temperature values with a calibrated set of amplifier gain setting values. The gain of at least one amplifier in the receiver, for example, a low noise amplifier may be adjusted based on the amplifier gain setting determined from the lookup table 216. The gain of at least one amplifier in a transmitter, for example, a power amplifier may be adjusted based on the amplifier gain setting determined from the lookup table 216.

Figure 3:
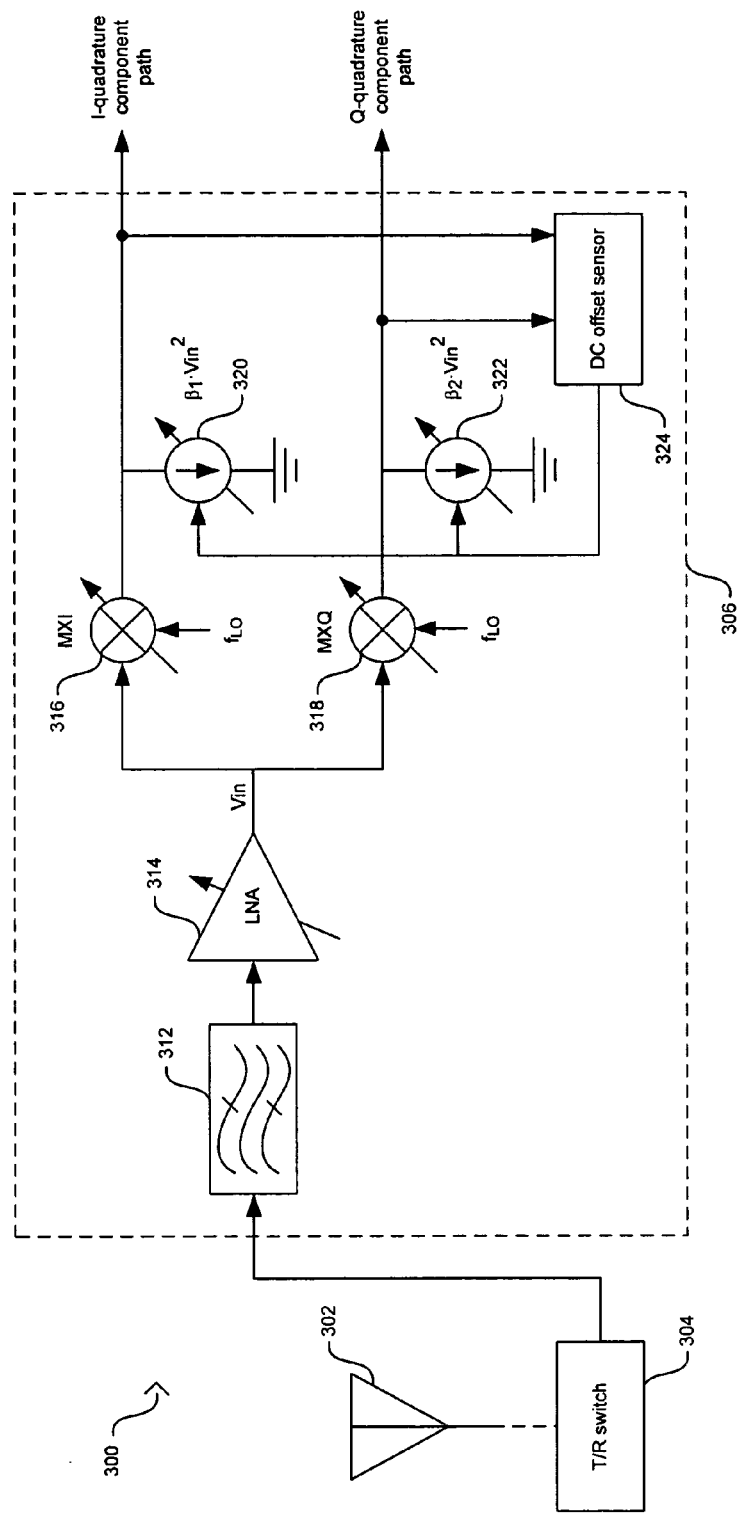
FIG. 3 is a block diagram that illustrates a receiver portion of an exemplary transceiver front end, in accordance with an embodiment of the invention.

FIG. 3 is a block diagram that illustrates a receiver portion of an exemplary transceiver front end, in accordance with an embodiment of the invention. Referring to FIG. 3, the transceiver front end 300 may comprise a transmit/receive (T/R) switch 304 and a receiver portion 306. The T/R switch 304 may comprise suitable logic, circuitry, and/or code that may be adapted to select between a transmit mode, in which signals may be transferred from the transceiver front end 300, and a receive mode, in which signals may be transferred from either an external antenna or a testing fixture, for example, to the transceiver front end 300. Whether the T/R switch 304 selects the transmit mode or the receive mode may be signaled by, for example, the controller/processor 106 in FIG. 1. Regarding the receive mode of operation, FIG. 3 shows an antenna 302 coupled to the T/R switch 304 with a dashed line to indicate that the antenna 302 may be one of a plurality of elements, components, and/or devices that may be coupled to the T/R switch 304.

The receiver portion 306 may comprise a bandpass filter 312, a low noise amplifier (LNA) 314, a "I" component mixer (MXI) 316, a "Q" component mixer (MXQ) 318, a first injection circuit 320, a second injection circuit 322, and a DC offset sensor 324. The receiver portion 306 may not be limited to the elements, components, and/or devices shown in FIG. 3 and may also comprise additional logic, circuitry, and/or code that may be adapted to further process the I/Q signal components. The bandpass filter 312 may comprise suitable logic, circuitry, and/or code that may be adapted to select signals in the bandpass of the channel of interest. The bandpass filter 312 may have a frequency band of 925 to 960 MHz, for example. The LNA 314 may comprise suitable logic, circuitry, and/or code that may be adapted amplify the output of the bandpass filter 312. Certain aspects of the LNA 314 may be programmed by, for example, the controller/processor 106 in FIG. 1. One of these aspects may be the gain applied by the LNA 314 to the output of the bandpass filter 312. In some instances, changing the gain in the LNA 314 may be required to compensate for changes in operating conditions.

The MXI 316 may comprise suitable logic, circuitry, and/or code that may be adapted to mix the output of the LNA 314, Vin, with the local oscillator frequency ($f_{LO}$) to produce a zero intermediate frequency (IF) "I" signal component. The "I" signal component may be a differential signal, for example. Certain aspects of the MXI 316 may be programmed by, for example, the controller/processor 106 in FIG. 1. The MXQ 318 may comprise suitable logic, circuitry, and/or code that may be adapted to mix the output of the LNA 314, Vin, with a local oscillator frequency ($f_{LO}$) to produce a zero IF "Q" signal component. The Q" quadrature signal component may be a differential signal, for example. Certain aspects of the MXQ 318 may be programmed by, for example, the controller/processor 106 in FIG. 1. A variable IF, for example, 100 KHz, 104 KHz, 108 KHz, or 112 KHz, may be utilized to trade between I/Q signal components matching and improving the performance of the receiver portion 306.

The first injection circuit 320 may comprise suitable logic, circuitry, and/or code that may be adapted to apply a first DC offset current on the "I" signal component path. The first DC offset current may be a current which may be expressed as $\beta_2 \cdot Vin^2$, where $\beta_1$ is a first proportionality parameter and Vin is the output of the LNA 314, for example. In some instances, the value of Vin may be that of a calibration voltage. The first proportionality parameter, $\beta_1$, may correspond to a complementary metal oxide semiconductor (CMOS) transconductance parameter representative of a portion of the transistors in the first injection circuit 320 that may be utilized to generate the first DC offset current. The current applied by the first injection circuit 320 may be a differential current, for example. Certain aspects of the first injection circuit 320 may be programmable and may be programmed by, for example, the DC offset sensor 324. Some of these aspects may be the amplitude and polarity of the first DC offset current.

The second injection circuit 322 may comprise suitable logic, circuitry, and/or code that may be adapted to apply a second DC offset current on the "Q" signal component path. The second DC offset current may be a current which may be expressed as $\beta_2 \cdot Vin^2$, where $\beta_2$ is a second proportionality parameter and Vin is the output voltage of the LNA 314. In some instances, the value of Vin may be that of a calibration voltage. The second proportionality parameter, $\beta_2$, may correspond to a CMOS transistor transconductance parameter representative of a portion of the transistors in the second injection circuit 322 that may be utilized to generate the first DC offset current. The current applied by the second injection circuit 322 may be a differential current, for example. Certain aspects of the second injection circuit 322 may be programmable and may be programmed by, for example, the DC offset sensor 324 Some of these aspects may be the amplitude and polarity of the second DC offset current.

The DC offset sensor 324 may comprise suitable logic, circuitry, and/of code that may be adapted to sense or detect DC offset levels in the "I" signal component path and/or the "Q" signal component path in the receiver portion 306. These DC offset levels may be DC offset currents and/or DC offset voltages. The DC offset sensor 324 may generate a parameter that represents the first DC offset current and/or a parameter that represents the second DC offset current based on the sensing or detection of the "I" signal component path and/or the "Q" signal component path respectively. The DC offset current parameters may comprise information regarding the manner in which the injection circuits may generate the DC offset currents and/or information regarding the value of Vin. The DC offset sensor 324 may then transfer the first DC offset current parameter to the first injection circuit 320 and the second DC offset current parameter to the second injection circuit 322. Sensing by the DC offset sensor 324 may be performed at instances which may be determined based on a schedule or as instructed by, for example, the controller/processor 106 in FIG. 1. In some instances, the DC offset sensor 324 may comprise a local memory that may be adapted to store the DC offset current parameters. The DC offset sensor 324 may also transfer the DC offset current parameters to the system memory 108 in FIG. 1 for digital storage via the controller/processor 106, for example. The DC offset sensor 324 may also be utilized to determine variations in circuit performance based on temperature change, operational changes such as voltage variations, and variations in the process utilized during integrated circuit (IC) manufacturing.

Figure 4:
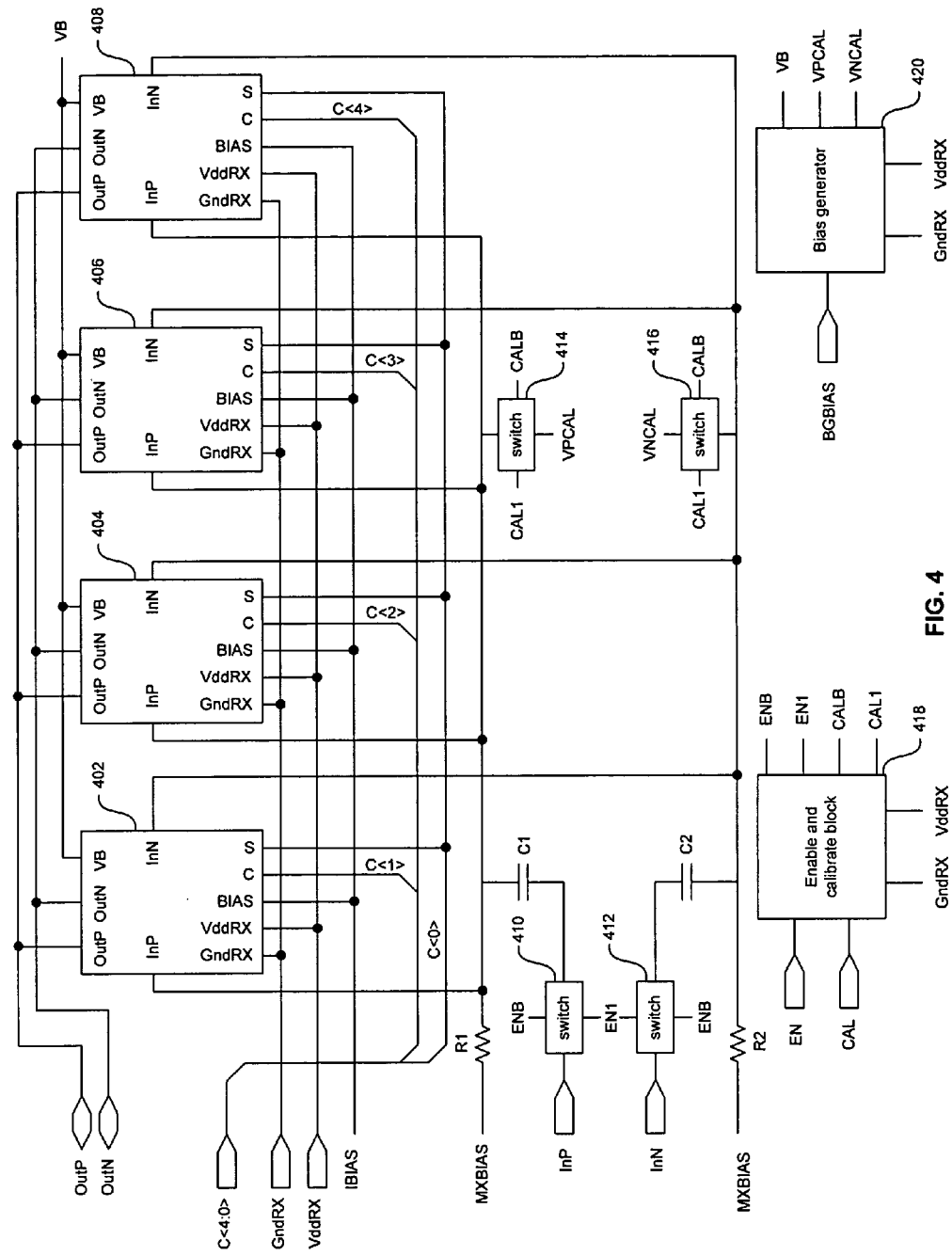
FIG. 4 is a block diagram of an exemplary injection circuit, in accordance with an embodiment of the invention.

FIG. 4 is a block diagram of an exemplary injection circuit, in accordance with an embodiment of the invention. Referring to FIG. 4, the injection circuits 320 and 322 in FIG. 3 may each comprise current drivers 402, 404, 406, and 408, a first switch 410, a second switch 412, a third switch 414, a fourth switch 416, an enable and calibrate block 418, and a bias generator block 420. While FIG. 4 illustrates four current drivers in an injection circuit, however, the invention may not be so limited and a plurality of current drivers may be utilized in an injection circuit in accordance with design specifications and in consideration of layout area and/or current resolution, for example. The injection circuits 320 and 322 may be utilized for correcting DC offset voltages that may result from non-linear effects in the receiver portion 306 may also be utilized for PVT measurement and calibration operations. In this regard, the injection circuits 320 and 322 may be operated in a plurality of modes.

The bias generator 420 may comprise suitable logic and/or circuitry that may be adapted to generate a plurality of voltages which may be utilized as reference levels in an injection circuit. The bias generator 420 may be based on a bandgap voltage reference circuit, for example. Notwithstanding, the bias generator 420 may utilize a bandgap bias (BGBIAS) signal as a basis from which at least one of the reference levels may be generated. The bias generator 420 may produce a voltage bias (VB) signal, a positive calibration voltage (VPCAL) signal, and a negative calibration voltage (VNCAL) signal, for example, where the VPCAL and VNCAL signals may correspond to a calibration voltage differential pair. The bias generator 420 may produce voltage references which may be fairly constant over a wide range of temperatures and/or process conditions.

The enable and calibrate block 418 may comprise suitable logic and/or circuitry and may be adapted to generate a plurality of signals which may be utilized to configure the operation of an injection circuit. For example, when an injection circuit is utilized to generate a DC offset current for DC offset voltage correction, the enable and calibrate block 418 may generate, from a first enable (EN) signal, a second enable (EN1) signal and an inverted second enable (ENB) signal. The EN1 signal may be a buffered version of the EN signal, for example. The EN signal may be communicated or transferred to the enable and calibrate block 418 from the processor/controller 106 in FIG. 1, for example. The EN1 and ENB signals may be utilized to turn ON or OFF switches 410 and 412 during DC offset current generation by an injection circuit. When switches 410 and 412 are turned ON, and switches 414 and 416 are turned OFF, a positive input voltage (InP) signal and a negative input voltage (InN) signal may be transferred or communicated to the corresponding InP and InN ports in the current drivers 402, 404, 406, and 408. The InP and InN signals may correspond to the differential voltage signal Vin from the LNA 314 in FIG. 3, for example. The current drivers 402, 404, 406, and 408 may then utilize the InP/InN differential voltage signal to generate weighted offset currents which may be added to produce a DC offset current.

In another example, when generating a DC offset current to determine the transconductance parameter β for a current set of PVT conditions, the enable and calibrate block 418 may generate, from a first calibrate (CAL) signal, a second calibrate (CAL1) signal and an inverted second calibrate (CALB) signal. The CAL1 signal may be a buffered version of the CAL signal, for example. The CAL signal may be communicated or transferred to the enable and calibrate block 418 from the processor/controller 106 in FIG. 1, for example. This mode of operation may also be utilized when correcting or adjusting the gain in the current drivers 402, 404, 406, and 408 for DC offset voltage correction in the I/Q signal component paths.

The CAL1 and CALB signals may be utilized to turn ON or OFF switches 414 and 416 during gain correction. When switches 414 and 416 are turned ON, and switches 410 and 412 are turned OFF, the VPCAL and VNCAL differential pair generated by the bias generator 420 may be transferred or communicated to the corresponding InP and InN ports in the current drivers 402, 404, 406, and 408. The current drivers 402, 404, 406, and 408 may then utilize the VPCAL/VNCAL differential voltage signal to generate weighted offset currents which may be added to produce a calibration DC offset current.

The switches 410, 412, 414, and 416 may comprise suitable logic and/or circuitry and may be adapted transfer a signal from an input port to an output port when the appropriate enabling signals are provided. For example, in the exemplary implementation shown in FIG. 4, when the EN1 signal is HIGH and the ENB signal is LOW, the switches 410 and 412 are both turned ON and the InP and InN differential voltage signal may be transferred to the current drivers 402, 404, 406, and 408 via capacitors C1 and C2. In this regard, capacitors C1 and C2 may provide AC coupling from the switches 410 and 412 to the current drivers. Resistors R1 and R2 may represent mixer output loads. In another exemplary implementation, when the EN1 signal is LOW and the ENB signal is HIGH, the switches 410 and 412 are both turned ON and the InP and InN differential voltage signal may be transferred to the current drivers 402, 404, 406, and 408 via capacitors C1 and C2. In either of these implementations, the switches 414 and 416 may both be turned OFF by the CALL and CALB signals.

In the exemplary implementation shown in FIG. 4, when the CALL signal is HIGH and the CALB signal is LOW, the switches 414 and 416 are both turned ON and the VPCAL and VNCAL differential voltage signal may be transferred to the current drivers 402, 404, 406, and 408 via capacitors C1 and C2. In another exemplary implementation, when the CAL1 signal is LOW and the CALB signal is HIGH, the switches 414 and 416 are both turned ON and the VPCAL and VNCAL differential voltage signal may be transferred to the current drivers 402, 404, 406, and 408 via capacitors C1 and C2. In either of these implementations, the switches 410 and 412 are both turned OFF by the EN1 and ENB signals. By enabling switches 414 and 416 as described above, the VPCAL/VNCAL differential voltage signal may be utilized as a stable reference to generate the DC offset current which may be utilized to determine the PVT conditions.

The current drivers 402, 404, 406, and 408 may comprise suitable logic and/or circuitry that may be adapted to generate weighted offset currents, where the weighted offset currents may be differential current signals. The positive output current (OutP) signal and the negative output current (OutN) signal in FIG. 4 may represent the differential nature of the weighted offset currents. The weighted offset currents may be added to produce a DC offset current in accordance with the configuration or mode of operation of the injection circuit. For example, the addition of the weighted offset currents produced by the current drivers may generate a DC offset current to compensate for a DC offset voltage when the injection circuit is configured so that the InP/InN differential voltage signal is communicated or transferred to the InP and InN ports of the current drivers. In another example, the addition of the weighted offset currents produced by the current drivers may generate a calibration DC offset current which may be utilized to performed a measurement of the PVT operating conditions when the injection circuit is configured so that the VPCAL/VNCAL differential voltage signal is communicated or transferred to the InP and InN ports of the current drivers.

The weighted offset currents produced by the current drivers 402, 404, 406, and 408 may be binary weighted and may have positive or negative polarity or sign. In an exemplary implementation of a binary weighted set of weighted offset currents, the current driver 402 may produce a 1 µA amplitude weighted offset current, the current driver 404 may produce a 2 µA amplitude weighted offset current, the current driver 406 may produce a 4 µA amplitude weighted offset current, and the current driver 408 may produce an 8 µA amplitude weighted offset current. To generate a DC offset current in the injection circuit of +7 µA, for example, the current drivers 402, 404, and 406 may be selected and the current driver 408 may not be selected. Moreover, a positive polarity output may be selected for each of the current drivers.

A plurality of current driver control signals may be utilized to select the current drivers for generating the weighted offset current to produce a DC offset current and also to select the polarity or sign of the DC offset current to be generated. The current driver control signals as shown in FIG. 4 may comprise a polarity selection signal, C<0>, a plurality of current driver selection signals, C<1:4>, and a current bias signal, IBIAS. In this exemplary implementation, the polarity selection signal C<0> may be transferred or communicated to all current drivers via an S port. The current driver selection signals C<1:4>, each representing one of the current drivers in the injection circuit, may be transferred or communicated to a corresponding current driver via a C port, for example. Moreover, the current bias signal IBIAS may be transferred or communicated to all current drivers via a BIAS port, for example.

In operation, the processor/controller 106 in FIG. 1 may transfer or communicate the EN and CAL signals to the injection circuits 320 and 322, for example. The CAL signal may be utilized to enable a PVT operating condition reading at various instances during the operation of the transceiver 100 in FIG. 1 and/or under controlled PVT operating conditions. The BGBIAS, IBIAS, receiver ground (GndRX) signal, and receiver supply (VddRX) signals may be transferred or communicated to the injection circuits 320 and 322 from other portions of the transceiver 100. The current driver control signals and/or the InP/InN differential voltage signal may be transferred or communicated to the injection circuits 320 and 322 from the DC offset sensor 324, for example.

The enable and calibrate block 418 may generate the EN1, ENB, CAL1, and CALB signals to select whether the InP/InN differential voltage signal or the VPCAL/VNCAL differential voltage signal may be transferred or communicated to the current drivers 402, 404, 406, and 408. The current drivers 402, 404, 406, and 408 may generate weighted offset currents in accordance with the current driver control signals, that is, the weighted offset currents may produce a DC offset current of the appropriate amplitude and polarity. The generated weighted offset currents in the injection circuit 320 or the injection circuit 322 may be added to produce DC offset current that may be utilized to determine the transconductance parameter β at a particular PVT operating condition. In this regard, when the PVT operating conditions are known, the DC offset current may be utilized as a nominal or reference value from which a nominal or reference transconductance parameter β may be determined. When the PVT operating conditions are not known, the DC offset current may be utilized to determine a transconductance parameter β which may be compared to a previously determined nominal or reference transconductance parameter β.

Figure 5:
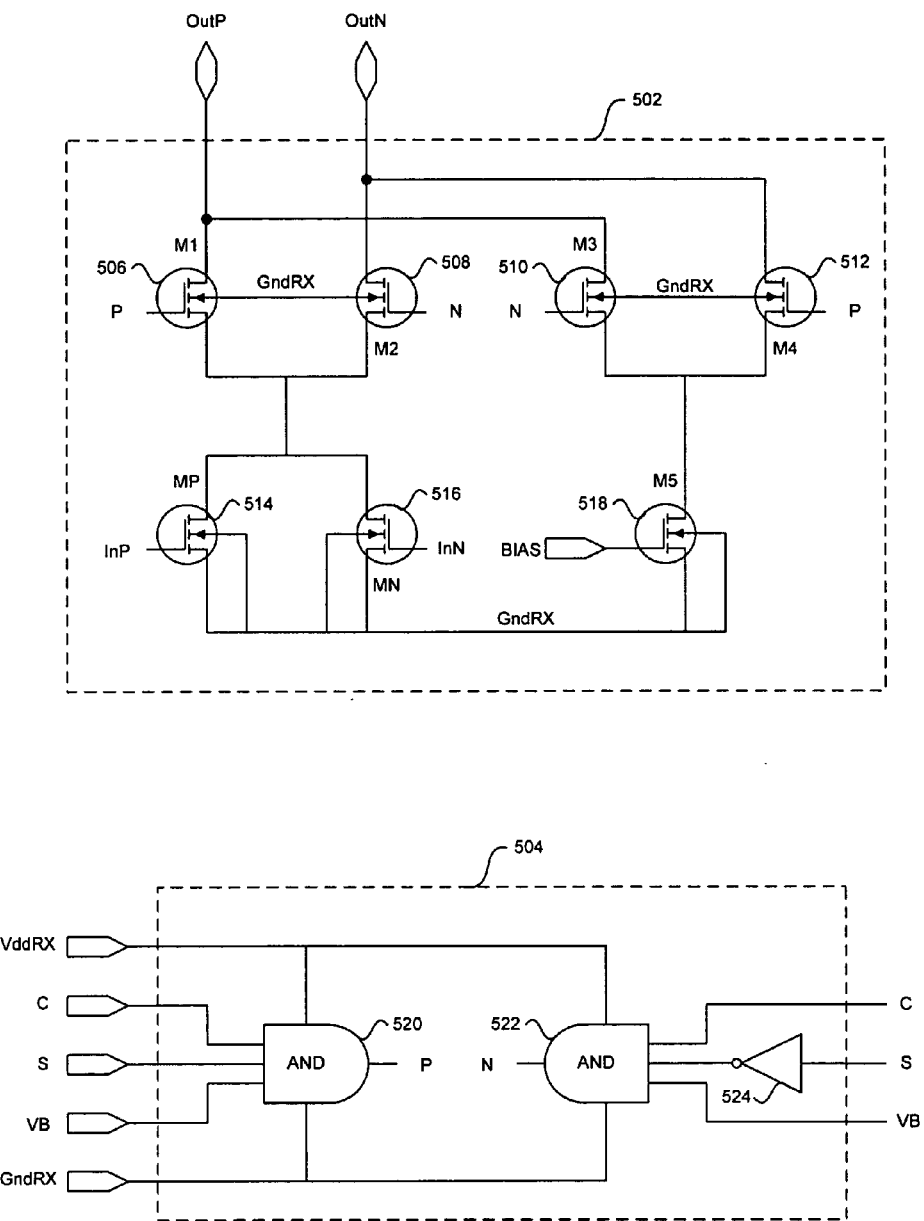
FIG. 5 is a block diagram of an exemplary current driver circuit, in accordance with an embodiment of the invention.

FIG. 5 is a block diagram of an exemplary current driver circuit, in accordance with an embodiment of the invention. Referring to FIG. 5, a current driver may comprise a current generator 502 and a polarity controller 504. The polarity controller 504 may comprise suitable logic and/or circuitry that may be adapted to generate a positive polarity signal and a negative polarity signal. In the exemplary implementation shown in FIG. 5, the polarity controller 504 may comprise a first AND gate 520, a second AND gate 522, and an inverter 524 gate. The first AND gate 520 may generate the positive polarity signal by ANDing the current driver selection signal and the polarity selection signal. In another exemplary implementation, the first AND gate 520 may generate the positive polarity signal by ANDing the current driver selection signal, the polarity selection signal, and the VB signal. The second AND gate 520 may generate the negative polarity signal by ANDing the current driver selection signal and an inverted polarity selection signal produced by the inverter 524. In another exemplary implementation, the second AND gate 522 may generate the negative polarity signal by ANDing the current driver selection signal, the inverted polarity selection signal, and the VB signal.

The current generator 502 may comprise a first NMOS transistor (M1) 506, a second NMOS transistor (M2) 508, a third NMOS transistor (M3) 510, a fourth NMOS transistor (M4) 512, a fifth NMOS transistor (M5) 518, a sixth NMOS transistor (MP) 514, and a seventh NMOS transistor (MN) 516. The MP 514, MN 516, and M5 518 transistors may be long channel transistors, where the channel length may be determined by design requirements such as differential linearity, for example. The exemplary implementation shown in FIG. 5 may not be limited to designs based on NMOS transistors, other types of designs, for example, PMOS and/or CMOS-based designs, may be utilized.

The current in the long channel transistors MP 514 and MN 516 may be expressed as $I=\frac{1}{2}\cdot\beta\cdot(V-V_{TH})^2$, where β is the transconductance parameter, V is the gate-to-source voltage, and $V_{TH}$ is the transistor threshold voltage. The transconductance parameter may be expressed by $\beta=\mu\cdot C_{ox}\cdot(W/L)$, where μ is the carrier mobility, $C_{OX}$ is the gate oxide capacitance, W is the transistor width, and L is the transistor length. The values for the carrier mobility, μ, and the gate oxide capacitance, $C_{OX}$, may depend on the manufacturing process and/or the temperature of operation. The value of the transconductance β may be the same for transistors MP 514 and MN 516. The voltage in the InP and InN ports may be expressed by $V(InP)=V_{DC}+A\cdot\sin(\omega_0 t)$ and $V(InN)=V_{DC}-A\cdot\sin(\omega_0 t)$ respectively, where $V_{DC}$ is a DC voltage, A is the amplitude of the time varying signal, and $\omega_0$ is the angular frequency of the time varying signal. The total current produced by the MP 514 and MN 516 transistor pair may be expressed by $I_{MP}+$ $I_{MN}=\frac{1}{2}\cdot\beta\cdot(V_{DC}+A\cdot\sin(\omega_0 t)-V_{TH})^2+\frac{1}{2}\cdot\beta\cdot(V_{DC}-A\cdot\sin(\omega_0 t)-V_{TH})^2=\frac{1}{2}\cdot(2\cdot\beta\cdot(V_{DC}-V_{TH})^2+\beta\cdot A^2\cdot\sin(2\omega_0 t))$, and may be approximated by $I_{MP}+I_{MN}\approx\beta\cdot(V_{DC}-V_{TH})^2+\frac{1}{2}\cdot\beta\cdot A^2$.

The IBIAS signal may be selected so that the current in the transistor M5 518 may be expressed by $I_{M5}=\beta_{M5}\cdot(V_{DC}-V_{TH})^2$, where $I_{M5}$ is a reference current in the current driver. The value of $\beta_{M5}$ for transistor M5 518 may be the same as the value of β for transistors MP 514 and MN 516. The amplitude of the OutP/OutN differential current signal from a current driver may be expressed by $(I_{MP}+I_{MN})-I_{M5}=\frac{1}{2}\cdot\beta\cdot A^2$. The value $\beta\cdot A^2$ may correspond to a portion of the first DC offset current, $\beta_1\cdot Vin^2$, in the injection circuit 320, for example. In this regard, the transconductance parameter β in each of the current drivers 402, 404, 406, and 408 may be binary weighted to produce the appropriate DC offset current. For example, for a given value of W and L, the transconductance parameter for transistors MP 514, MN 516, and M5 518 in the current driver 402 may be $\beta=\mu\cdot C_{OX}\cdot(W/L)$, for current driver 404 may be $\beta=\mu\cdot C_{OX}\cdot(2\cdot W/L)$, for current driver 406 may be $\beta=\mu\cdot C_{OX}\cdot(4\cdot W/L)$, and for the current driver 408 may be $\beta=\mu\cdot C_{OX}\cdot(8\cdot W/L)$.

During PVT measurements, in which the switches 414 and 416 are turned on ON, the effective value of β for an injection circuit may be determined from $\beta=2\cdot I_{DC}/A^2$, where A is known from the VPCAL/VNCAL differential voltage signal utilized for calibration and $I_{DC}$ is the DC offset current produced by the injection circuit for a given current driver control signal. The effective value of β may be further modified by considering the DC offset that may result from mismatches between the transistors MP 514, MN 516, and M5 518.

In operation, when both the current driver selection signal and the polarity selection signal are HIGH, the polarity controller 504 may generate a HIGH positive polarity signal and a LOW negative polarity signal, for example. When the current driver selection signal is HIGH and the polarity selection signal is LOW, the polarity controller 504 may generate a LOW positive polarity signal and a HIGH negative polarity. When the current driver selection signal is LOW, the current driver is not selected and both the positive and negative polarity signals are LOW.

In the exemplary implementation shown in FIG. 5, when the positive polarity signal is HIGH and the negative polarity signal is LOW, the transistors M1 506 and M4 512 are ON and the transistors M2 508 and M3 510 are OFF. In this case, the $I_{MP}+I_{MN}$ current goes to the OutP port and the $I_{M5}$ current goes to the OutN port to produce a weighted offset current of positive polarity and an amplitude of abs[$(I_{MP}+I_{MN})-I_{M5}$], where the function abs[ ] is an absolute value function. When the positive polarity signal is LOW and the negative polarity signal is HIGH, the transistors M1 506 and M4 512 are OFF and the transistors M2 508 and M3 510 are ON. In this case, the $I_{MP}+I_{MN}$ current goes to the OutN port and the $I_{M5}$ current goes to the OutP port to produce a weighted offset current of negative polarity and an amplitude of abs[$(I_{MP}+I_{MN})-I_{M5}$]. When the current driver is not selected, transistors M1 506, M2 508, M3 510, and M4 512 are OFF and no current is generated at ports OutP and OutN in the current driver.

Figure 6:
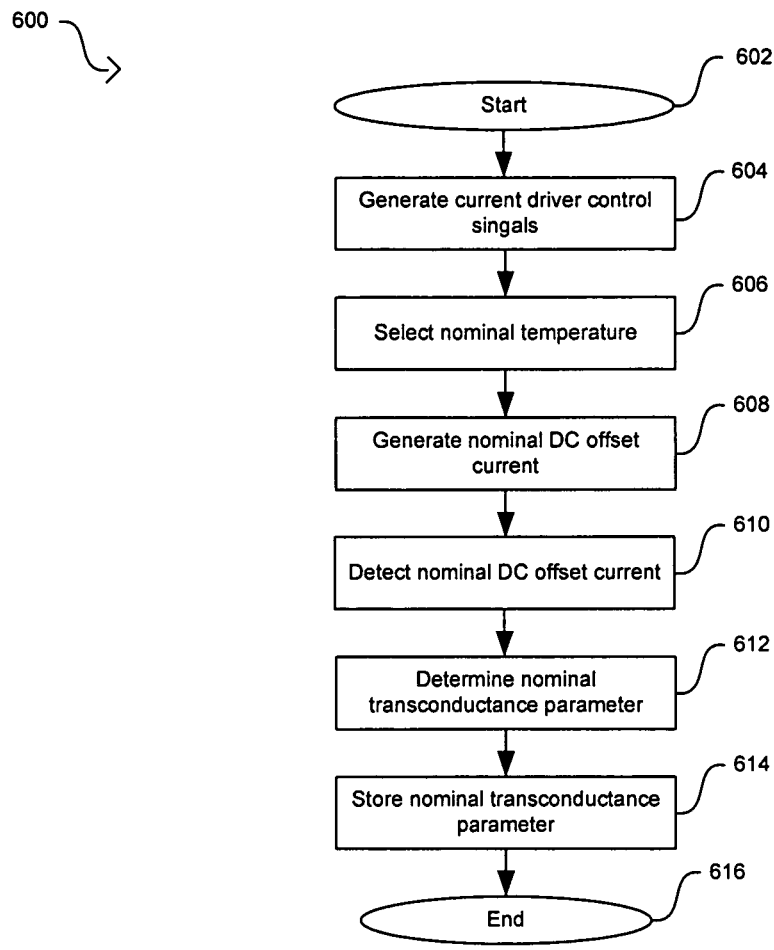
FIG. 6 is a flow diagram illustrating exemplary steps that may be utilized during PVT measurement and calibration operation when utilizing a nominal temperature, in accordance with an embodiment of the invention.

FIG. 6 is a flow diagram illustrating exemplary steps that may be utilized during PVT measurement and calibration operation when utilizing a nominal temperature, in accordance with an embodiment of the invention. Referring to FIG. 6, after start step 602, the DC offset sensor 324 may generate a plurality of current driver control signals in step 604 that correspond to a DC offset current. The current driver control signals may provide an approximate amplitude and a polarity of the DC offset current that may actually be generated by an injection circuit. In step 606, a nominal temperature, $T_{NOM}$, may be selected for PVT measurement and calibration. For example, the transceiver 100 in FIG. 1 may be at a room temperature of 20° C., in which case the nominal temperature is 20° C. When the temperature of the transceiver 100 is controllable, for example, during production testing, prototype development, or even in certain controllable environments, the nominal temperature may be selected from a plurality of temperatures that may fall within the controllable range. In step 608, an injection circuit, for example, the injection circuits 320 or 322, may be utilized to generate a DC offset current based on the current driver control signals from step 604 and the calibration voltage. In this regard, the injection circuit may select the calibration voltage since it provides a stable voltage value over a wide range of temperatures and process conditions. Either the injection circuit 320 or the injection circuit 322 may be utilized in this step.

In step 610, the DC offset sensor 324 may detect the DC offset current generated by the injection circuit. The DC offset sensor 324 may be adapted to detect a DC offset current in either the "I" signal component path or the "Q" signal component path. In step 612, the nominal transconductance parameter, $\beta_{NOM}$, may be determined based on, for example, the expression $\beta_{NOM}=2 \cdot I_{DC}/A^2$, where $I_{DC}$ is the DC offset current detected at $T_{NOM}$ and A is the amplitude of the calibration voltage. Determining $\beta_{NOM}$, or a parameter that is proportional to $\beta_{NOM}$, may be performed in, for example, the processor/controller 106 in FIG. 1, or in an external processor and/or controller that may be coupled to the transceiver 100. Since the nominal transconductance parameter may be expressed by $\beta_{NOM}=(\mu \cdot C_{OX})_{NOM} \cdot (W/L)$, where the ratio W/L remains fairly constant over temperature and process, then the factor $(\mu \cdot C_{OX})_{NOM}$ may be a parameter that, being proportional to $\beta_{NOM}$, may be determined in step 610.

In step 614, $\beta_{NOM}$ and/or $(\mu \cdot C_{OX})_{NOM}$ may be stored in, for example, the system memory 108 in FIG. 1. In this regard, a parameter that represents $\beta_{NOM}$ and/or $(\mu \cdot C_{OX})_{NOM}$ may be stored when it may be appropriate for simplifying and/or optimizing processing operations. The lookup table 212 shown in FIG. 2 may be a portion of the system memory 108 in which $\beta_{NOM}$ and/or $(\mu \cdot C_{OX})_{NOM}$ or a parameter that represents $\beta_{NOM}$ and/or $(\mu \cdot C_{OX})_{NOM}$ may be stored. After step 614, the flow diagram 600 may proceed to end step 616.

By comparing $\beta_{NOM}$ and/or $(\mu \cdot C_{OX})_{NOM}$ to a current reading or measurement for a different operating condition, changes over temperature and/or process may be determined. For example, when the reading indicates a value that is lower than $\beta_{NOM}$ or $(\mu \cdot C_{OX})_{NOM}$, then the temperature conditions may be higher than $T_{NOM}$ and/or the process may be slower than under the conditions when $\mu_{NOM}$ or $(\mu \cdot C_{OX})_{NOM}$ were determined. When the reading indicates a value that is higher than $\beta_{NOM}$ or $(\mu C_{OX})_{NOM}$, then the temperature conditions may be lower than $T_{NOM}$ and/or the process may be faster than under the conditions when $\beta_{NOM}$ or $(\mu \cdot C_{OX})_{NOM}$ were determined.

Figure 7:
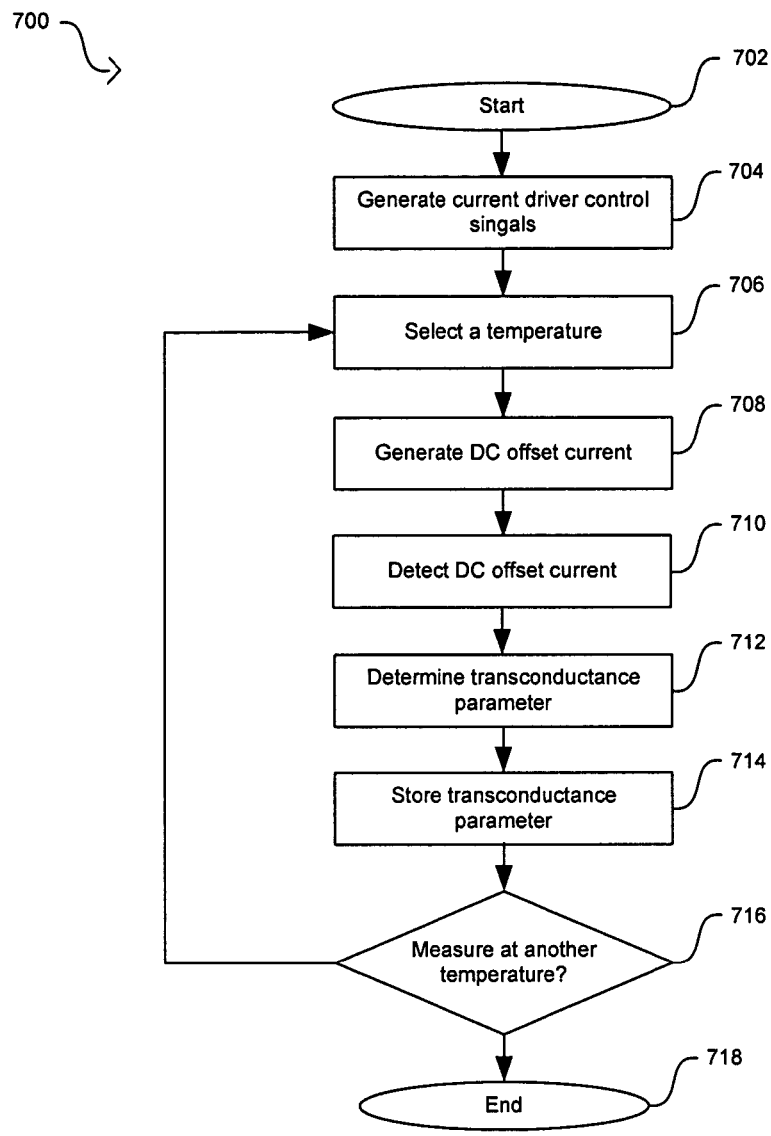
FIG. 7 is a flow diagram illustrating exemplary steps that may be utilized during PVT measurement and calibration operation when utilizing a range of temperatures, in accordance with an embodiment of the invention.

FIG. 7 is a flow diagram illustrating exemplary steps that may be utilized during PVT measurement and calibration operation when utilizing a range of temperatures, in accordance with an embodiment of the invention. Referring to FIG. 7, after start step 702, the DC offset sensor 324 may generate a plurality of current driver control signals in step 704 that correspond to a DC offset current. The current driver control signals may provide for an approximate amplitude and a polarity of the DC offset current that may actually be generated by an injection circuit. In step 706, a current calibration temperature, $T_{CAL}$, may be selected from a controllable range of temperatures for PVT measurement and calibration. For example, the transceiver 100 in FIG. 1 may be at a room temperature of 20° C., in which case the nominal temperature is 20° C. When the temperature of the transceiver 100 is controllable, for example, during production testing, prototype development, or even in certain controlled operating environments, the nominal temperature may be selected from a plurality of temperatures that may fall within the controllable range. In step 708, an injection circuit, for example, the injection circuits 320 or 322, may be utilized to generate a DC offset current based on the current driver control signals from step 704 and the calibration voltage. In this regard, the injection circuit may select the calibration voltage since it provides a stable voltage value over a wide range of temperatures and process conditions. Either the injection circuit 320 or the injection circuit 322 may be utilized in this step.

In step 710, the DC offset sensor 324 may detect the DC offset current generated by the injection circuit. The DC offset sensor 324 may detect a DC offset current in either the "I" signal component path or the "Q" signal component path. In step 712, the nominal transconductance parameter, $\beta_{NOM}$, may be determined based on, for example, the expression $\beta=2 \cdot I_{DC}/A^2$, where $I_{DC}$ is the DC offset current detected at $T_{CAL}$ and A is the amplitude of the calibration voltage. Determining $\beta$, or a parameter that is proportional to $\beta$, may be performed in, for example, the processor/controller 106 in FIG. 1, or in an external processor and/or controller that may be coupled to the transceiver 100. Since the nominal transconductance parameter may be expressed by $\beta=(\mu \cdot C_{OX}) \cdot (W/L)$, where the ratio W/L remains fairly constant over temperature and process, then the factor $(\mu \cdot C_{OX})$ may be a parameter that, being proportional to $\beta$, may be determined in step 610.

In step 714, $\beta$ and/or $(\mu \cdot C_{OX})$ may be stored in, for example, the system memory 108 in FIG. 1. In this regard, a parameter that represents $\beta$ and/or $(\mu \cdot C_{OX})$ may be stored when it may be appropriate for simplifying and/or optimizing processing operations. The lookup table 212 shown in FIG. 2 may be a portion of the system memory 108 in which $\beta$ and/or $(\mu \cdot C_{OX})$ or a parameter that represents $\beta$ and/or $(\mu \cdot C_{OX})$ may be stored.

The transceiver 100 may utilize a plurality of calibration temperatures for a more precise determination of the current temperature and/or process conditions. For example, the temperature readings may be performed at different temperature intervals in the range −25° C. to 125° C. This may provide the transceiver 100 with more resolution when determining ways and/or means to compensate for increases or decreases in temperature conditions and/or faster or slower processing conditions. In step 716, the transceiver 100 may determine whether additional condition readings remain to be performed in accordance to a selected number of readings within the controllable range of measurement conditions. When additional readings need to be performed, the flow diagram 700 may proceed to step 706 where a next value of the current calibration temperature, $T_{CAL}$, may be determined. When all necessary readings have been completed, the flow diagram 700 may proceed to end step 718.

Sensing and/or measuring the PVT operating conditions may be performed automatically every few milliseconds, for example, and/or when it may be appropriate so as to not interfere with the radio functions of the RF transceiver system 100 in FIG. 1. The PVT measurement may be performed during an idle time in the operation of the RF transceiver system 100, for example. In this regard, the processor/controller 106 in FIG. 1 may be adapted to determine when a PVT measurement may be made. This measurement may be performed to either update the current stored readings and/or to compare the measurements with the current stored readings to determine the current PVT operating conditions. Moreover, the processor/controller 106 may be adapted to control the operation of the RF transceiver system 100 to guarantee that PVT sensing occurs during an idle time.

The approach described above may provide an efficient and accurate determination of the variations in the PVT operating conditions in an RF transceiver.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for process, voltage, and temperature (PVT) measurement and calibration, the method comprising:
    detecting a nominal DC offset current in a radio frequency (RF) receiver, wherein said nominal DC offset current is generated at a nominal operating temperature by an injection circuit in a first operating mode and is based on a calibration voltage, wherein the injection circuit comprises current drivers and switches, and wherein each output of each switch is coupled to an input of each current driver;
    determining a nominal transconductance parameter based on said detected nominal DC offset current and said calibration voltage;
    storing said determined nominal transconductance parameter;
    selecting a polarity for said nominal DC offset current based on a polarity selection signal; and
    generating, by the injection circuit in a second operating mode, an injection DC offset current equal to the product of the nominal transconductance parameter and a square of an out gut voltage of a low-noise amplifier coupled to the injection circuit, the injection DC offset current being generated based on a plurality of current driver control signals,
    wherein the nominal transconductance parameter is based on an output of the injection circuit.

2. A method for process, voltage, and temperature (PVT) measurement and calibration, the method comprising:
    detecting a plurality of DC offset currents in a radio frequency (RF) receiver, wherein said plurality of DC offset currents are generated at a plurality of operating temperatures by an injection circuit in a first operating mode and are based on a calibration voltage, wherein the injection circuit comprises current drivers and switches, and wherein each output of each switch is coupled to an input of each current driver;
    determining a plurality of transconductance parameters based on said detected plurality of DC offset currents and said calibration voltage;
    storing said determined plurality of transconductance parameters;
    selecting a polarity for said detected plurality DC offset currents based on a polarity selection signal;
    selecting one of the stored plurality of transconductance parameters based on an output voltage of a low-noise amplifier coupled to the injection circuit; and
    generating, by the injection circuit in a second operating mode, an injection DC offset current equal to the product of the selected transconductance parameter and a square of the output voltage of the low-noise amplifier, the injection DC offset current being generated based on a plurality of current driver control signals,
    wherein the plurality of transconductance parameters are based on outputs of the injection circuit.

3. A system for process, voltage, and temperature (PVT) measurement and calibration, the system comprising:
    a DC offset sensor that detects a nominal DC offset current in a radio frequency (RF) receiver, wherein said nominal DC offset current is generated at a nominal operating temperature by an injection circuit in a first operating mode and is based on a calibration voltage, wherein the injection circuit comprises current drivers and switches, and wherein each output of each switch is coupled to an input of each current driver;
    at least one processor that determines a nominal transconductance parameter based on said detected nominal DC offset current and said calibration voltage;
    a memory that stores said determined nominal transconductance parameter; and
    the injection circuit that selects a polarity for said nominal DC offset current based on a polarity selection signal,
    wherein the injection circuit in a second operating mode generates an injection DC offset current equal to the product of the nominal transconductance parameter and a square of an output voltage of a low-noise amplifier coupled to the injection circuit, the injection DC offset current being generated based on a plurality of current driver control signals, and
    wherein the nominal transconductance parameter is based on an output of the injection circuit.

4. A system for process, voltage, and temperature (PVT) measurement and calibration, the system comprising:
    a DC offset sensor that detects a plurality of DC offset currents in a radio frequency (RF) receiver, wherein said plurality of DC offset currents are generated at a plurality of operating temperatures by an injection circuit in a first operating mode and are based on a calibration voltage, wherein the injection circuit comprises current drivers and switches, and wherein each output of each switch is coupled to an input of each current driver;

at least one processor that determines a plurality of transconductance parameters based on said detected plurality of DC offset currents and said calibration voltage;

a low-noise amplifier coupled to the injection circuit the low-noise amplifier producing an output voltage; and a memory that stores said determined plurality of transconductance parameters, wherein the injection circuit selects a polarity for said plurality of DC offset currents based on a polarity selection signal, wherein the injection circuit in a second operating mode generates a plurality of injection DC offset currents equal to, the products of a square of the output voltage of the low-noise amplifier and corresponding ones of the stored transconductance parameters, the plurality of injection DC offset currents being generated based on a plurality of current driver control signals, and wherein the plurality of transconductance parameters are based on outputs of the injection circuit.

5. A machine-readable storage having stored thereon, a computer program having at least one code for process, voltage, and temperature (PVT) measurement and calibration, the at least one code being executable by a machine for causing the machine to perform steps comprising:

detecting a nominal DC offset current in a radio frequency (RF) receiver, wherein said nominal DC offset current is generated at a nominal operating temperature by an injection circuit in a first operating mode and is based on a calibration voltage, wherein the injection circuit comprises current drivers and switches, and wherein each output of each switch is coupled to an input of each current driver;

determining a nominal transconductance parameter based on said detected nominal DC offset current and said calibration voltage;

storing said determined nominal transconductance parameter;

selecting a polarity for said nominal DC offset current based on a polarity selection signal; and generating an injection DC offset current equal to the product of the nominal transconductance parameter and a square of an output voltage of a low-noise amplifier coupled to the injection circuit, the infection DC offset being generated based on a plurality of current driver control signals by the injection circuit in a second operating mode, wherein the nominal transconductance parameter is based on an output of the injection circuit.

6. The machine-readable storage according to claim 5, comprising code for detecting said nominal DC offset current in an "I" (in-phase) signal component path in said RF receiver.

7. The machine-readable storage according to claim 5, comprising code for detecting said nominal DC offset current in a "Q" (quadrature) signal component path in said RF receiver.

8. A machine-readable storage having stored thereon, a computer program having at least one code for process, voltage, and temperature (PVT) measurement and calibration, the at least one code being executable by a machine for causing the machine to perform steps comprising:

detecting a nominal DC offset current in a radio frequency (RF) receiver, wherein said nominal DC offset current is generated at a nominal operating temperature by an injection circuit in a first operating mode and is based on a calibration voltage, wherein the injection circuit comprises current drivers and switches, and wherein each output of each switch is coupled to an input of each current driver;

determining a nominal transconductance parameter based on said detected nominal DC offset current and said calibration voltage;

storing said determined nominal transconductance parameter;

selecting a polarity for said nominal DC offset current based on a polarity selection signal;

selecting said nominal operating temperature;

controlling the RF receiver to have an of temperature substantially equal to the selected nominal operating temperature; and generating said nominal DC offset current based on a plurality of current driver control signals by the injection circuit in a second operating mode.

9. The method according to claim 1, comprising detecting said nominal DC offset current in an "I" (in-phase) signal component path in said RF receiver.

10. The method according to claim 1, comprising detecting said nominal DC offset current in a "Q" (quadrature) signal component path in said RF receiver.

11. A method for process, voltage, and temperature (PVT) measurement and calibration, the method comprising:

detecting a nominal DC offset current in a radio frequency (RF) receiver, wherein said nominal DC offset current is generated at a nominal operating temperature by an injection circuit in a first operating mode and is based on a calibration voltage, wherein the injection circuit comprises current drivers and switches, and wherein each output of each switch is coupled to an input of each current driver;

determining a nominal transconductance parameter based on said detected nominal DC offset current and said calibration voltage;

storing said determined nominal transconductance parameter;

selecting a polarity for said nominal DC offset current based on a polarity selection signal;

selecting said nominal operating temperature;

controlling the RF receiver to have an operating temperature substantially equal to the selected nominal operating temperature; and generating said nominal DC offset current based on a plurality of current driver control signals by the injection circuit in a second operating mode.

12. The method according to claim 2, comprising detecting said plurality of DC offset currents in an "I" (in-phase) signal component path in said RF receiver.

13. The method according to claim 2, comprising detecting said plurality of DC offset currents in a "Q" (quadrature) signal component path in said RF receiver.

14. A method for process, voltage, and temperature (PVT) measurement and calibration, the method comprising:

detecting a plurality of DC offset currents in a radio frequency (RF) receiver, wherein said plurality of DC offset currents are generated at a plurality of operating temperatures by an injection circuit in a first operating mode and are based on a calibration voltage, wherein the injection circuit comprises current drivers and switches, and wherein each output of each switch is coupled to an input of each current driver;

determining a plurality of transconductance parameters based on said detected plurality of DC offset currents and said calibration voltage;

storing said determined plurality of transconductance parameters;

selecting a polarity for said detected plurality of DC offset currents based on a polarity selection signal;

selecting a range for said plurality of operating temperatures;

controlling the RF receiver to have an operating temperature within the selected range of the plurality of operating temperatures; and generating, by the injection circuit in a second operating mode, each of said plurality of DC offset currents based on a plurality of current driver control signals.

15. The system according to claim 3, wherein said DC offset sensor detects said nominal DC offset current in an "I" (in-phase) signal component path in said RF receiver.

16. The system according to claim 3, wherein said DC offset sensor detects said nominal DC offset current in a "Q" (quadrature) signal component path in said RF receiver.

17. A system for process, voltage, and temperature (PVT) measurement and calibration, the system comprising:
- a DC offset sensor that detects a nominal DC offset current in a radio frequency (RF) receiver, wherein said nominal DC offset current is generated at a nominal operating temperature by an injection circuit in a first operating mode and is based on a calibration voltage, wherein the injection circuit comprises current drivers and switches, and wherein each output of each switch is coupled to an input of each current driver;
- at least one processor that determines a nominal transconductance parameter based on said detected nominal DC offset current and said calibration voltage; and
- a memory that stores said determined nominal transconductance parameter,
- wherein the injection circuit selects a polarity for said nominal DC offset current based on a polarity selection signal,
- wherein said memory stores said nominal operating temperature, and
- wherein the injection circuit in a second operating mode generates an injection DC offset current equal to the product of the nominal transconductance parameter and a square of an output voltage of a low-noise amplifier coupled to the injection circuit, the injection DC offset being generated based on a plurality of current driver control signals, and
- wherein the nominal transconductance parameter is based on an output of the injection circuit.

18. The system according to claim 3, wherein said memory comprises a look-up table.

19. The system according to claim 4, wherein said DC offset sensor detects said plurality of DC offset currents in an "I" (in-phase) signal component path in said RF receiver.

20. The system according to claim 4, wherein said DC offset sensor detects said plurality of DC offset currents in a "Q" (quadrature) signal component path in said RF receiver.

21. A system for process, voltage, and temperature (PVT) measurement and calibration, the system comprising:
- a DC offset sensor that detects a plurality of DC offset currents in a radio frequency (RF) receiver, wherein said plurality of DC offset currents are generated at a plurality of operating temperatures by an injection circuit in a first operating mode and are based on a calibration voltage, wherein the injection circuit comprises current drivers and switches, and wherein each output of each switch is coupled to an input of each current driver;
- at least one processor that determines a plurality of transconductance parameters based on said detected plurality of DC offset currents and said calibration voltage; and
- a memory that stores said determined plurality of transconductance parameters,
- wherein the injection circuit selects a polarity for said plurality of DC offset currents based on a polarity selection signal,
- wherein said memory stores said plurality of operating temperatures,
- wherein the injection circuit in a second operating mode generates a plurality of injection DC offset currents equal to products of a square of an output voltage of a low-noise amplifier coupled to the injection circuit and corresponding ones of the stored transconductance parameters, the plurality of injection DC offset currents being generated based on a plurality of current driver control signals, and
- wherein the plurality of transconductance parameters are based on outputs of the injection circuit.

22. The system according to claim 4, wherein said memory comprises a look-up table.

* * * * *

UNITED STATES PATENT AND TRADEMARK OFFICE
CERTIFICATE OF CORRECTION

| | | |
|---|---|---|
| PATENT NO. | : 8,620,249 B2 | Page 1 of 1 |
| APPLICATION NO. | : 10/977000 | |
| DATED | : December 31, 2013 | |
| INVENTOR(S) | : Darabi | |

It is certified that error appears in the above-identified patent and that said Letters Patent is hereby corrected as shown below:

In the Claims

Column 15, line 62, claim 1, replace "an out gut voltage" with --an output voltage--
Column 17, line 5, claim 4, replace "injection circuit the" with --injection circuit, the--
Column 17, line 14, claim 4, replace "equal to, the products" with --equal to the products--
Column 17, line 44, claim 5, replace "the infection DC offset" with --the injection DC offset--
Column 18, line 12, claim 8, replace "have an of temperature" with --have an operating temperature--

Signed and Sealed this
Twentieth Day of May, 2014

Michelle K. Lee
*Deputy Director of the United States Patent and Trademark Office*